(12) United States Patent
Masuoka et al.

(10) Patent No.: US 12,116,648 B2
(45) Date of Patent: Oct. 15, 2024

(54) COLD-ROLLED STEEL SHEET AND METHOD FOR MANUFACTURING THE SAME, AND COLD-ROLLED STEEL SHEET FOR ANNEALING

(71) Applicant: JFE Steel Corporation, Tokyo (JP)

(72) Inventors: Hiroyuki Masuoka, Tokyo (JP); Shinichi Furuya, Tokyo (JP); Akira Matsuzaki, Tokyo (JP); Hayato Takeyama, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 773 days.

(21) Appl. No.: 17/042,388

(22) PCT Filed: Mar. 20, 2019

(86) PCT No.: PCT/JP2019/011723
§ 371 (c)(1),
(2) Date: Sep. 28, 2020

(87) PCT Pub. No.: WO2019/188667
PCT Pub. Date: Oct. 3, 2019

(65) Prior Publication Data
US 2021/0115530 A1    Apr. 22, 2021

(30) Foreign Application Priority Data
Mar. 30, 2018    (JP) .................. 2018-067012

(51) Int. Cl.
*C21D 9/46* (2006.01)
*C21D 6/00* (2006.01)
(Continued)

(52) U.S. Cl.
CPC .............. *C21D 9/46* (2013.01); *C21D 6/005* (2013.01); *C21D 6/008* (2013.01); *C21D 8/0205* (2013.01);
(Continued)

(58) Field of Classification Search
None
See application file for complete search history.

(56) References Cited

U.S. PATENT DOCUMENTS

| | | |
|---|---|---|
| 2013/0149526 A1 | 6/2013 | Masuoka et al. |
| 2014/0370330 A1 | 12/2014 | Sato |
| 2018/0010224 A1 | 1/2018 | Norden et al. |

FOREIGN PATENT DOCUMENTS

| | | |
|---|---|---|
| CN | 1461357 A | 12/2003 |
| CN | 103290308 A | 9/2013 |

(Continued)

OTHER PUBLICATIONS

Machine translation of JP 2013-237912A. (Year: 2013).*

(Continued)

*Primary Examiner* — Xiaowei Su
(74) *Attorney, Agent, or Firm* — Buchanan Ingersoll & Rooney PC

(57) ABSTRACT

An object is to provide a cold-rolled steel sheet having excellent phosphatability, even in the case where a phosphating solution has a low temperature, and a method for manufacturing the steel sheet, and a cold-rolled steel sheet for annealing.
A cold-rolled steel sheet for annealing has a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities, in which Si and/or Si oxide exists on a surface of the steel sheet with an average coating thickness of 1 nm to 20 nm.

7 Claims, 1 Drawing Sheet

(51) Int. Cl.
  *C21D 8/02* (2006.01)
  *C22C 38/00* (2006.01)
  *C22C 38/04* (2006.01)
  *C22C 38/06* (2006.01)
  *C23C 28/04* (2006.01)

(52) U.S. Cl.
  CPC ......... *C21D 8/0236* (2013.01); *C21D 8/0273* (2013.01); *C22C 38/002* (2013.01); *C22C 38/04* (2013.01); *C22C 38/06* (2013.01); *C23C 28/04* (2013.01)

(56) References Cited

FOREIGN PATENT DOCUMENTS

| EP | 1382717 | A1 |   | 1/2004 |
|----|---------|----|---|--------|
| EP | 3272892 | A1 |   | 1/2018 |
| IN | 107429344 | A |   | 12/2017 |
| JP | 3266328 | B2 |   | 3/2002 |
| JP | 2003113441 | A |   | 4/2003 |
| JP | 2005281787 | A |   | 10/2005 |
| JP | 3889769 | B2 |   | 3/2007 |
| JP | 2007092134 | A |   | 4/2007 |
| JP | 2007113108 | A | * | 5/2007 |
| JP | 4698968 | B2 |   | 6/2011 |
| JP | 2012132092 | A |   | 7/2012 |
| JP | 2012188694 | A |   | 10/2012 |
| JP | 2013060630 | A |   | 4/2013 |
| JP | 2013237912 | A |   | 11/2013 |
| JP | 2014240505 | A1 |   | 12/2014 |
| JP | 2018505314 | A |   | 2/2018 |
| KR | 20130014903 | A |   | 2/2013 |
| TW | 201213550 | A |   | 4/2012 |
| WO | 2013099712 | A1 |   | 7/2013 |
| WO | 2014017010 | A1 |   | 1/2014 |

OTHER PUBLICATIONS

Machine translation of JP3889769B2. (Year: 2007).*
Machine translation of JP 2014-240505A. (Year: 2014).*
Machine translation of JP 2007-113108A. (Year: 2007).*
International Search Report and Written Opinion for International Application No. PCT/JP2019/011723, mailed Jun. 18, 2019, with partial translation, 5 pages.
Chinese Office Action with Search Report for Chinese Application No. 201980023851.9, dated Aug. 17, 2021, 12 pages.
Extended European Search Report for European Application No. 19 778 299.8, dated Mar. 9, 2021, 8 pages.
Japanese Office Action for Japanese Application No. 2020-510785, dated Oct. 29, 2020, with Concise Statement of Relevance of Office Action, 8 pages.
Korean Office Action for Korean Application No. 10-2020-7028054, dated Oct. 12, 2021, with Concise Statement of Relevance of Office Action, 6 pages.

* cited by examiner

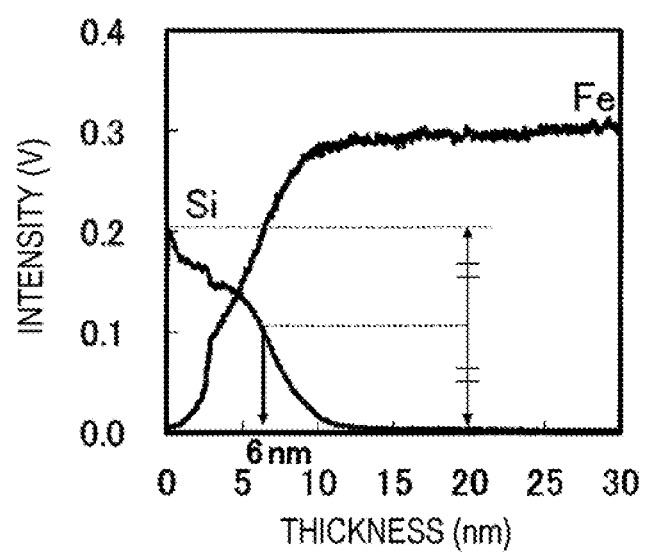

COLD-ROLLED STEEL SHEET AND METHOD FOR MANUFACTURING THE SAME, AND COLD-ROLLED STEEL SHEET FOR ANNEALING

CROSS REFERENCE TO RELATED APPLICATIONS

This is the U.S. National Phase application of PCT/JP2019/011723, filed Mar. 20, 2019, which claims priority to Japanese Patent Application No. 2018-067012, filed Mar. 30, 2018, the disclosures of these applications being incorporated herein by reference in their entireties for all purposes.

FIELD OF THE INVENTION

The present invention relates to a cold-rolled steel sheet having good phosphatability in a pre-paint treatment process (phosphating process), which is performed on a cold-rolled steel sheet that is used for an automobile body, and a method for manufacturing the steel sheet, and to a cold-rolled steel sheet for annealing.

BACKGROUND OF THE INVENTION

To decrease the amount of industrial waste (the amount of sludge generated) and to decrease running costs, there is a growing trend toward decreasing the temperature of a phosphating solution (hereinafter, a low-temperature phosphating solution may be referred to as a "phosphating solution of a low-temperature type") and decreasing the thickness of an electrodeposition coating. As a result of decreasing the temperature of a phosphating solution, there is a significant decrease in the reactivity of the phosphating solution with a steel sheet compared with the case where a conventional phosphating condition is applied. On the other hand, since there is a trend toward decreasing the thickness of an electrodeposition coating, homogeneously forming phosphate crystals and improving the adhesiveness of an electrodeposition coating are considered to be greatly important.

The reactivity between a phosphating solution and the surface of a steel sheet decreases with a decrease in the temperature of a phosphating solution. Therefore, it is considered that, in the case of a phosphating solution of a low-temperature type, even a small amount of oxides formed during continuous annealing may function as a reactivity-decreasing factor and causes a deterioration in phosphatability. Moreover, in consideration of a trend toward decreasing the thickness of an electrodeposition coating, it is anticipated that such a deterioration in phosphatability increasingly affects the adhesiveness of a coating and after-coating corrosion resistance.

As an example of a measure against the deterioration in phosphatability due to the decrease in the temperature of a phosphating solution, Patent Literature 1 proposes a method for improving phosphatability in which oxides formed on the surface of a steel sheet are removed by performing pickling and re-pickling.

In addition, as described in Patent Literature 2, there is also a technique in which alloy elements that inhibits Si, which causes the deterioration in phosphatability, from being concentrated on the surface of a steel sheet during continuous annealing are added. In the case of the method according to Patent Literature 2, phosphatability is ensured by adding Ni or Cu to inhibit the surface concentration that causes the deterioration in phosphatability.

In addition, as described in Patent Literature 3, there is also a technique for ensuring phosphatability in which a Si—Mn balance in the steel is appropriately controlled so that Mn—Si complex oxides, which do not decrease reactivity between a phosphating solution and the surface of a steel sheet, is formed during continuous annealing.

PATENT LITERATURE

PTL 1: Japanese Unexamined Patent Application Publication No. 2012-132092
PTL 2: Japanese Patent No. 3266328
PTL 3: Japanese Patent No. 3889769

SUMMARY OF THE INVENTION

However, even in the case of the cold-rolled steel sheet described in Patent Literature 1, it is not possible to achieve sufficient coating adhesiveness because there is a trend toward decreasing the thickness of an electrodeposition coating.

In addition, in the case of the method according to Patent Literature 2, since Ni or Cu, which are expensive alloy elements, are used, an increase in the cost is inevitable.

In addition, in the case of Patent Literature 3, since Si is added to steel, there is an increase in cost due to the addition of Si, and there may be a case where it is not possible to achieve satisfactory mechanical properties such as tensile strength and elongation, which are required for a steel sheet.

Aspects of the present invention have been completed in view of the situation described above, and an object according to aspects of the present invention is to provide a cold-rolled steel sheet having excellent phosphatability, even in the case where a phosphating solution has a low temperature, and a method for manufacturing the steel sheet, and to provide a cold-rolled steel sheet for annealing.

The present inventors conducted investigations to solve the problems described above and, as a result, found that it is possible to achieve good phosphatability by making Mn—Si complex oxides having a major axis of 200 nm or less exist on the surface of a steel sheet after annealing and/or by controlling an area fraction of oxides having a large grain diameter existing on the surface of the steel sheet after annealing to be equal to or less than a certain value. Oxides having a major axis of 200 nm or less are significantly minute and have high solubility in a phosphating solution. As a result, it is possible to achieve good phosphatability. However, unless Si is contained in a steel sheet in an amount of 0.10 mass % or more, it is not possible to form Mn—Si complex oxides having a major axis of 200 nm or less, and it is difficult to make the area fraction of oxides having a large grain diameter to be low. There is no problem in the case of a steel sheet which is required to contain Si in an amount of 0.10 mass % or more to achieve properties required for the steel sheet. However, in the case of a steel sheet containing Si in an amount of less than 0.10 mass %, that is, in the case of a steel sheet which is not necessarily required to contain Si in an amount of 0.10 mass % or more from the viewpoint of required properties, manufacturing restrictions, and/or manufacturing costs, oxides having a large grain diameter of more than 200 nm are formed during annealing. It was found that the oxides having a large grain diameter of more than 200 nm remain undissolved for more than a predetermined time in a phosphating solution, which results in a deterioration in phosphatability.

Therefore, the present inventors further conducted investigations for the case that a Si content in the steel sheet of 0.10 mass % or more is regarded as a problem from the viewpoint of required properties, manufacturing restrictions, and/or manufacturing costs. The purpose of the investigation is to make Mn—Si complex oxides having a major axis of 200 nm or less exist on the surface of a steel sheet after annealing and/or to control the area fraction of oxides having a large grain diameter existing on the surface of a steel sheet after annealing to be equal to or less than a certain value, even in the case where a Si content in the steel sheet is less than 0.10 mass %. As a result, the present inventors found that, by applying Si atoms to the surface of a steel sheet in advance before continuous annealing and reacting the Si atoms with Mn atoms, which are concentrated during continuous annealing, it is possible to achieve the purpose described above, which results in an improvement in phosphatability.

Aspects of the present invention have been completed on the basis of the knowledge described above, and the subject matter according to aspects of the present invention is as follows.

[1] A cold-rolled steel sheet for annealing, the steel sheet having a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities, in which Si and/or Si oxide exists on a surface of the steel sheet with an average coating thickness of 1 nm to 20 nm.

[2] The cold-rolled steel sheet for annealing according to item [1], in which the chemical composition further contains one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less.

[3] The cold-rolled steel sheet for annealing according to item [1] or [2], in which the chemical composition further contains one, two, or more selected from Ni: 2.0 mass % or less, Cu: 2.0 mass % or less, Ca: 0.1 mass % or less, and REM: 0.1 mass % or less.

[4] A method for manufacturing a cold-rolled steel sheet, the method including applying Si and/or Si oxide to a surface of a steel sheet with an average coating thickness of 1 nm to 20 nm, the steel sheet having a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities and thereafter performing annealing.

[5] The method for manufacturing a cold-rolled steel sheet according to item [4], in which the steel sheet has the chemical composition further containing one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less.

[6] The method for manufacturing a cold-rolled steel sheet according to item [4] or [5], in which the steel sheet has the chemical composition further containing one, two, or more selected from Ni: 2.0 mass % or less, Cu: 2.0 mass % or less, Ca: 0.1 mass % or less, and REM: 0.1 mass % or less.

[7] A cold-rolled steel sheet having a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities, in which an area fraction of oxides having a major axis of more than 200 nm existing on a surface of the steel sheet is less than 1%.

[8] The cold-rolled steel sheet according to item [7], in which the chemical composition further contains one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less.

[9] The cold-rolled steel sheet according to item [7] or [8], in which the chemical composition further contains one, two, or more selected from Ni: 2.0 mass % or less, Cu: 2.0 mass % or less, Ca: 0.1 mass % or less, and REM: 0.1 mass % or less.

[10] A cold-rolled steel sheet having a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities, in which an area fraction of Mn—Si complex oxides having a major axis of 200 nm or less existing on a surface of the steel sheet is 1% to 10%.

[11] The cold-rolled steel sheet according to item [10], in which the chemical composition further contains one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less.

[12] The cold-rolled steel sheet according to item [10] or [11], in which the chemical composition further contains one, two, or more selected from Ni: 2.0 mass % or less, Cu: 2.0 mass % or less, Ca: 0.1 mass % or less, and REM: 0.1 mass % or less.

[13] The cold-rolled steel sheet according to any one of items [10] to [12], in which an area fraction of oxides having a major axis of more than 200 nm existing on the surface of the steel sheet is less than 1%.

[14] A method for manufacturing the cold-rolled steel sheet according to any one of items [10] to [13], the method including applying Si and/or Si oxide to the surface of the steel sheet with an average coating thickness of 1 nm to 20 nm, and thereafter performing annealing.

[15] The cold-rolled steel sheet according to any one of items [7] to [13], in which the steel sheet is a cold-rolled steel sheet which is further subjected to phosphating.

According to aspects of the present invention, it is possible to obtain a cold-rolled steel sheet and a cold-rolled steel sheet for annealing having excellent phosphatability, even in the case where a phosphating solution of a low-temperature type is used.

BRIEF DESCRIPTION OF THE DRAWINGS

The FIGURE is a graph illustrating the Si thicknesses on the surfaces of No. 5 test pieces given in Examples in Table 2 determined by using GDS.

DETAILED DESCRIPTION OF EMBODIMENTS OF THE INVENTION

First, the basic technological idea according to aspects of the present invention will be described.

Usually, in an annealing process utilizing a continuous annealing furnace, which is performed to recrystallize a cold-rolled steel sheet so that the steel sheet has desired microstructure, strength, and workability, a non-oxidizing or reducing gas is used as an atmosphere gas, and the dew point of the atmosphere gas is tightly controlled. Therefore, in the case of a common cold-rolled steel sheet, which contains alloy elements in small amounts, oxidation of the surface of the steel sheet is suppressed. However, in the case of a steel sheet containing Mn, Al, and Si, which are more easily oxidizable than Fe, such elements more easily oxidizable than Fe, are selectively oxidized, even if the chemical composition and dew point of the atmosphere gas for annealing are tightly controlled. Therefore, it is not possible to avoid formation of oxides containing such easily oxidizable elements on the surface of the steel sheet. In addition, since the oxides containing the easily oxidizable elements described above are formed on the surface of the steel sheet, etching treatability of the surface of the steel sheet during phosphating, which is performed as a pretreatment of electrodeposition coating, is deteriorated. In particular, in the case of a phosphating solution of a low-temperature type, it is considered that a sound phosphating coating is not formed, which results in a significant deterioration in the adhesiveness of an electrodeposition coating when the electrodeposition coating is thin.

To achieve good phosphatability with which the surface of a steel sheet sufficiently reacts even in a phosphating solution of a low-temperature type, it is considered necessary to make the kind of oxides formed on the surface of the steel sheet more soluble than conventional oxides.

The present inventors conducted investigations regarding a method for making the kinds of oxides more soluble in response to the trend toward decreasing the temperature of a phosphating solution. As a result, the present inventors found that it is possible to improve phosphatability by applying Si atoms to the surface of a steel sheet in advance before performing continuous annealing so that the Si atoms react with atoms (Mn), which are concentrated during continuous annealing. Thereby, as the kind of oxides, Mn—Si complex oxides having a very small grain diameter, which have high solubility in a phosphating solution, are formed on the surface of the steel sheet. In addition, it was also found that, by controlling the area fraction of oxides having a major axis of more than 200 nm to be less than 1% on the surface of the steel sheet by performing the similar treatment, it is possible to improve phosphatability. Here, the term "low-temperature phosphating solution" denotes a phosphating solution having a temperature of 33° C. to 37° C.

Hereafter, the reasons for the limitations on the chemical composition of the cold-rolled steel sheet according to aspects of the present invention will be described.

C: 0.01 mass % to 0.30 mass %

C is an important element which has the function of increasing the strength of a steel sheet. To achieve tensile strength (270 MPa to 1470 MPa), which is required for an automotive steel sheet, it is necessary that the C content be 0.01 mass % or more. On the other hand, in the case where the C content is more than 0.30 mass %, it is difficult to perform welding in an automobile-manufacturing process. Here, it is preferable that the C content be 0.02 mass % to 0.20 mass %.

Si: less than 0.10 mass % (including 0.0 mass %)

Generally, Si increases the strength and decreases the elongation of a steel sheet. Since the ranges of required strength and required elongation are determined depending on intended application of the steel sheet, there are applications in which a Si content of 0.10 mass % or more is not appropriate. In addition, in the case of such applications, unnecessary addition of Si causes an increase in cost. Therefore, the Si content is set to be less than 0.10 mass %.

Note that, in the case where it is possible to achieve desired tensile strength by only controlling the C content, Si need not be added (the Si content may be 0.0 mass %). Here, it is preferable that the Si content be 0.05 mass % or less.

Mn: 2.0 mass % to 3.5 mass %

Like Si, Mn concentrates on the surface of a steel sheet during continuous annealing and forms Mn—Si complex oxides. In the case where the Mn content is high, Mn—Si complex oxides having a large grain diameter are formed. Such oxides remain undissolved for more than a predetermined phosphating time and inhibit the precipitation of phosphate crystals. Therefore, the Mn content is set to be 2.0 mass % to 3.5 mass %. Here, it is preferable that the Mn content be 2.0 mass % to 2.8 mass %.

P: 0.05 mass % or less

P is an element effective for adjusting the strength of steel. It is preferable that the P content be 0.005 mass % or more. On the other hand, P is an element that causes a deterioration in spot weldability, but there is no problem in the case where the P content is 0.05 mass % or less. Therefore, the P content is set to be 0.05 mass % or less. Here, it is preferable that the P content be 0.02 mass % or less.

S: 0.01 mass % or less

S is an impurity inevitably contained and is a harmful constituent that causes deterioration in the stretch flange formability of a steel sheet because of being precipitated in the form of MnS in steel. To avoid the deterioration in stretch flange formability, the S content is set to be 0.01 mass % or less. It is preferable that the S content be 0.005 mass % or less or, more preferably, 0.003 mass % or less.

Al: 0.15 mass % or less

Al is an element added as a deoxidizing agent in a steelmaking process and is also effective for separating non-metal inclusions, which cause a deterioration in stretch flange formability, to form slag. Therefore, it is preferable that the Al content be 0.01 mass % or more. On the other hand, in the case where the Al content is more than 0.15 mass %, there is a deterioration in the surface quality of a steel sheet. Therefore, the Al content is set to be 0.15 mass % or less.

The cold-rolled steel sheet according to aspects of the present invention may further contain one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less in addition to the chemical composition described above.

Nb, Ti, and V improve formability, and in particular, stretch flange formability by forming carbides and nitrides that inhibit ferrite grain growth during heating in annealing and to thereby decrease the grain diameter of a microstructure. Therefore, these elements may be added in an amount of more than 0 mass % within the ranges described above. Mo, Cr, and B promote formation of bainite and martensite and improve hardenability of steel. Therefore, these elements may be added in an amount of more than 0 mass % within the ranges described above. N contributes to increase the strength of steel by forming nitrides with Nb, Ti, and V or by forming solid solution in steel. Therefore, N may be added in an amount of more than 0 mass %. On the other hand, in the case where the N content is excessively large, a large amount of nitrides is formed, and fracturing occurs due to the formation of voids during press forming. Therefore, in the case where N is added, it is preferable that the N content be 0.008 mass % or less.

In addition, the cold-rolled steel sheet according to aspects of the present invention may further contain one, two, or more selected from Ni: 2.0 mass % or less, Cu: 2.0 mass % or less, Ca: 0.1 mass % or less, and REM: 0.1 mass % or less in addition to the chemical composition described above.

Since Ni and Cu are effective for increasing the strength of steel by promoting formation of low-temperature-transformation phases, these elements may be added in an amount of more than 0 mass % within the ranges described above. In addition, since Ca and REM (rare earth metals) improve the stretch flange formability of a steel sheet by controlling the shapes of sulfide-based inclusions, these elements may be added in an amount of more than 0 mass % within the ranges described above.

In the case of the cold-rolled steel sheet according to aspects of the present invention, the remainder which is different from the constituents described above is Fe and inevitable impurities. However, other constituents may be added to the extent that the effects according to aspects of the present invention are not decreased.

The cold-rolled steel sheet according to aspects of the present invention is characterized in that Mn—Si complex oxides having a major axis of 200 nm or less exist on the surface of the steel sheet in an amount of 1% to 10% in terms of area fraction and/or that the area fraction of oxides having a major axis of more than 200 nm existing on the surface of a steel sheet is less than 1%. The Mn—Si complex oxides having a major axis of 200 nm or less are significantly minute and have high solubility in a phosphating solution. As a result, it is possible to achieve good phosphatability. The oxides having a major axis of more than 200 nm remain undissolved in a phosphating solution for more than a predetermined phosphating time, which may deteriorates the phosphatability. However, by controlling the area fraction of the Mn—Si complex oxides having a major axis of 200 nm or less existing on the surface of a steel sheet to be 1% to 10%, the Mn—Si complex oxides having a major axis of 200 nm or less dissolves within the predetermined phosphating time. As a result, it is possible to avoid the deterioration in phosphatability due to the remaining undissolved oxides.

Similarly, by controlling the area fraction of oxides having a major axis of more than 200 nm existing on the surface of the steel sheet to be less than 1%, it is possible to avoid the deterioration in phosphatability.

In accordance with aspects of the present invention, examples of the Mn—Si complex oxides include $Mn_2SiO_4$ and $MnSiO_3$. In addition, in accordance with aspects of the present invention, examples of the oxides other than the Mn—Si complex oxides include MnO.

The major axis of the Mn—Si complex oxides may be determined, for example, by taking a secondary electron image by using a scanning electron microscope with an accelerating voltage of 0.8 kV at a magnification of 30,000 times and by determining the length of the largest Mn—Si complex oxide in the field of view of the image. In addition, the area fraction of the Mn—Si complex oxides having a major axis of 200 nm or less is determined by performing EDS (energy dispersive X-ray spectroscopy) mapping with an accelerating voltage of 5 kV in the field of view in the secondary electron image described above and by determining the area fraction of oxides having a Si intensity of 2 wt % or more.

In the case of the cold-rolled steel sheet according to aspects of the present invention, when the area fraction of the Mn—Si complex oxides having a major axis of 200 nm or less existing on the surface of the steel sheet is 1% to 10%, it is preferable that the area other than that occupied by the Mn—Si complex oxides having a major axis of 200 nm or less is occupied by Mn oxides having a major axis of 200 nm or less other than the Mn—Si complex oxides and the basis metal of the steel sheet. That is, according to aspects of the present invention, it is preferable that none of the oxides, including the Mn—Si complex oxides, having a major axis of more than 200 nm exists on the surface of the cold-rolled steel sheet. More specifically, according to aspects of the present invention, it is preferable that none of the oxides such as MnO, $Mn_2SiO_4$, and/or $MnSiO_3$ having a major axis of more than 200 nm exists on the surface of the cold-rolled steel sheet.

The major axis of oxides other than the Mn—Si complex oxides may be determined, as in the case of the Mn—Si complex oxides, by taking a secondary electron image by using a scanning electron microscope with an accelerating voltage of 0.8 kV at a magnification of 30,000 times and by determining the length of the largest oxide in the field of view of the image. In addition, examples of a state in which oxides having a major axis of more than 200 nm do not exist on the surface of the steel sheet include a state in which the area fraction of oxides having a major axis of more than 200 nm existing in the field of view in the secondary electron image described above is less than 1%. It is possible to determine the area fraction of oxides having a major axis of more than 200 nm by determining the area fraction of the oxides having a major axis of more than 200 nm in the field of view in the secondary electron image described above.

On the other hand, in the case of the cold-rolled steel sheet according to aspects of the present invention, when the area fraction of oxides having a major axis of more than 200 nm existing on the surface of the steel sheet is less than 1%, it is preferable that the area other than that occupied by the oxides having a major axis of more than 200 nm is occupied by oxides having a major axis of 200 nm or less and the basis metal of the steel sheet.

The cold-rolled steel sheet for annealing according to aspects of the present invention has a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities, in which Si and/or Si oxide exists on the surface of the steel sheet in a form of a coating having an average thickness of 1 nm to 20 nm. The present cold-rolled steel sheet for annealing also has excellent phosphatability after annealing, even in the case where a phosphating solution of a low-temperature type is used.

The cold-rolled steel sheet for annealing according to aspects of the present invention may further contain one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less in addition to the chemical composition described above.

In addition, the cold-rolled steel sheet for annealing according to aspects of the present invention may further contain one, two, or more selected from Ni: 2.0 mass % or less, Cu: 2.0 mass % or less, Ca: 0.1 mass % or less, and REM: 0.1 mass % or less in addition to the chemical composition described above.

In addition, the cold-rolled steel sheet for annealing according to aspects of the present invention may further contain one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less and one, two, or more selected from Ni: 2.0 mass % or less, Cu: 2.0 mass % or less, Ca: 0.1 mass % or less, and REM: 0.1 mass % or less in addition to the chemical composition described above.

Hereafter, the method for manufacturing the cold-rolled steel sheet according to aspects of the present invention will be described.

The method for manufacturing the cold-rolled steel sheet according to aspects of the present invention is characterized by performing annealing after applying Si and/or Si oxide in the form of a coating having an average thickness of 1 nm to 20 nm to the surface of a steel sheet. By applying Si atoms (Si and/or Si oxide) to the surface of a steel sheet in advance before annealing so that Si atoms react with Mn atoms, which are concentrated during continuous annealing, it is possible to form Mn—Si complex oxides having a major axis of 200 nm or less on the surface of a steel sheet, and it is possible to control the area fraction of oxides having a major axis of more than 200 nm on the surface of the steel sheet to be less than 1%. In accordance with aspects of the present invention, since a comparatively small amount of Si and/or Si oxide is applied to the surface of a steel sheet, such Si is soaked into Mn—Si complex oxides when the Mn—Si complex oxides are formed. As a result, the surface of the cold-rolled steel sheet according to aspects of the present invention may have a region in which the basis metal of the steel sheet is exposed.

To apply Si atoms to the surface of a steel sheet before annealing, Si and/or Si oxide may be applied to the surface of the steel sheet. An example of the Si oxide include $SiO_2$. In addition, in accordance with aspects of the present invention, to form Mn—Si complex oxides having a major axis of 200 nm or less on the surface of the steel sheet, and/or to control the area fraction of oxides having a major axis of more than 200 nm formed on the surface of the steel sheet to be less than 1%, Si and/or Si oxide are applied to the surface of the steel sheet in the form of a coating having an average thickness of 1 nm to 20 nm.

There is no particular limitation on the method for applying Si and/or Si oxide to the surface of a steel sheet, and any method is acceptable as long as it is possible to apply Si atoms (Si and/or Si oxide) in an amount equivalent to a thickness of 1 nm to 20 nm. For example, a PVD method (physical vapor deposition) may be used. A PVD method, which may also be called as a physical vapor growth, is a method in which an intended material is deposited on the surface of another material in a shape of a thin film by using a physical method in a gas phase. Examples of specific PVD methods include an evaporation method, an ion plating method, an ion beam deposition method, and a sputtering method, and any of these methods may be used. Here, instead of a dry process such as PVD, applying Si atoms to the surface of a steel sheet by a wet process, in which dipping in a solution is performed, is also effective. As an example of the wet process, a process of preparing a Si-containing aqueous solution of a chloride, a sulfate, or a nitrate, spraying the solution, and drying may be performed.

Any kind of oxide may be used as an oxide to apply a Si oxide to the surface of a steel sheet as long as the oxide contains Si, and examples of the oxide include $SiO_2$ and SiO. In addition, any kind of chemical compound may be used to apply Si to the surface of a steel sheet as long as the chemical compound contains Si, and examples of the chemical compound include sodium silicate.

After the annealing of the cold-rolled steel sheet having a coating of Si and/or Si oxide having a thickness of 1 nm to 20 nm on the surface thereof, ordinary processes such as a skin pass rolling are performed to obtain a product steel sheet.

There is no particular limitation on the conditions for manufacturing the steel sheet, and, as in the case of an ordinary steel sheet, it is acceptable that the steel sheet is obtained in such a manner that molten steel having the chemical composition described above is prepared by using, for example, a converter, the molten steel is made into a slab by using a continuous casting method or an ingot casting method, and the obtained slab is subjected to hot rolling followed by cold rolling. Subsequently, it is acceptable that, after the Si atoms are applied to the surface of the obtained steel sheet, continuous annealing is performed. In addition, skin pass rolling may be performed after the continuous annealing.

Here, it is preferable that annealing is performed under the following conditions.

Dew point: −35° C. or lower

In the case where the dew point is higher than −35° C., there is a marked increase in the amount of oxides formed during annealing, and there is a significant deterioration in phosphatability. Therefore, it is preferable that the dew point during annealing is −35° C. or lower, or more preferably −40° C. or lower.

Holding temperature: 750° C. to 900° C.

In the case where the holding temperature during annealing is lower than 750° C., sufficient recrystallization does not occur and there is a deterioration in workability. On the other hand, in the case where the holding temperature is higher than 900° C., the grain diameter of a steel microstructure increases and strength-workability balance deteriorates. Therefore, it is preferable that the holding temperature during annealing is 750° C. to 900° C.

Holding time: 60 seconds or more

In the case where the holding time for annealing is less than 60 seconds, inhomogeneous recrystallization occurs. Therefore, it is preferable that the holding time for annealing is 60 seconds or more, or more preferably 120 seconds or more.

By using the manufacturing method described above, it is possible to obtain a cold-rolled steel sheet having excellent phosphatability, even in the case where a phosphating solution of a low-temperature type is used.

The cold-rolled steel sheet for annealing according to aspects of the present invention is obtained by applying Si and/or Si oxide in the form of a coating having an average thickness of 1 nm to 20 nm to the surface of a steel sheet having a chemical composition containing C: 0.01 mass % to 0.30 mass %, Si: less than 0.10 mass % (including 0.0 mass %), Mn: 2.0 mass % to 3.5 mass %, P: 0.05 mass % or less, S: 0.01 mass % or less, and Al: 0.15 mass % or less, the balance being Fe and inevitable impurities. The cold-rolled steel sheet for annealing obtained by using such a manufacturing method also has excellent phosphatability after annealing, even in the case where a phosphating solution of a low-temperature type is used. The cold-rolled steel sheet for annealing having the chemical composition described above which further contains one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less and the cold-rolled steel sheet for annealing having the chemical composition described above which further contains one, two, or more selected from Ni: 2.0 mass % or less, Cu: 2.0 mass % or less, Ca: 0.1 mass % or less, and REM: 0.1 mass % or less also have excellent phosphatability after annealing. In addition, the cold-rolled steel sheet for annealing having the chemical composition described above which further contains one, two, or more selected from Nb: 0.3 mass % or less, Ti: 0.3 mass % or less, V: 0.3 mass % or less, Mo: 0.3 mass % or less, Cr: 0.5 mass % or less, B: 0.006 mass % or less, and N: 0.008 mass % or less and one, two, or more selected from Ni: 2.0 mass % or less, Cu: 2.0 mass % or less, Ca: 0.1 mass % or less, and REM: 0.1 mass % or less also has excellent phosphatability after annealing, even in the case where a phosphating solution of a low-temperature type is used.

EXAMPLES

Examples of the present invention will be described below. Here, the present invention is not limited to the examples below.

The molten steels given in Table 1 were prepared by performing an ordinary refining process involving a converter, a degassing treatment, and so forth and made into steels (slabs) by performing continuous casting. Subsequently, the obtained steels were subjected to hot rolling followed by pickling and cold rolling so as to be made into steel sheets having a thickness of 1.8 mm.

TABLE 1

| Steel Grade | Chemical Composition (mass %) | | | | | |
|---|---|---|---|---|---|---|
| | C | Si | Mn | P | S | Al |
| A | 0.01 | 0.002 | 3.5 | 0.03 | 0.005 | 0.12 |
| B | 0.12 | 0.09 | 2.1 | 0.04 | 0.003 | 0.11 |
| C | 0.29 | 0.05 | 2.7 | 0.02 | 0.004 | 0.14 |
| D | 0.12 | 0.15 | 2.5 | 0.04 | 0.003 | 0.11 |

Note:
Underlined portions indicate items out of the range of the present invention.

Subsequently, by applying Si and/or Si oxide in the form of a coating having the thicknesses given in Table 2 to the surfaces of these steel sheets by performing PVD, cold-rolled steel sheets for annealing were obtained. Subsequently, the obtained cold-rolled steel sheets for annealing were subjected to annealing at temperatures given in Table 2 and were subjected to skin pass rolling with an elongation ratio of 0.7% so as to be made into the cold-rolled steel sheets of Nos. 1 through 18 in Table 2. The cold-rolled steel sheet of No. 10, which was the reference example, was a cold-rolled steel sheet which needed to contain Si in an amount of 0.10 mass % or more. The PVD apparatus used was a batch-type ion plating apparatus of a high-frequency-excitation (RF) type, produced by Showa Shinku Co., Ltd.

Here, the distributions of Si and Fe in the depth direction of the surface of a test piece taken from each of the steel sheets after the PVD were determined by using a GDS (glow discharge spectrometer) to check the thickness of the coating of Si and/or Si oxide. The GDS was used under the conditions of an argon gas pressure of 2.9 hPa and a constant current of 50 mA. The FIGURE is a graph illustrating the Si thicknesses on the surfaces of No. 5 test piece on the basis of the observation results of the surfaces of the test pieces obtained by using the GDS. As indicated in the FIGURE, the thickness of the coating of the Si and/or Si oxide was defined as the half-value width at which the Si profile takes a value equal to the half of its maximum value, and the thickness of the applied Si and/or Si oxide is determined.

By taking test pieces from each of the cold-rolled steel sheets obtained by the annealing, the oxides on the surface of the steel sheet were investigated under the conditions described below, and the phosphatability was evaluated by performing phosphating with a phosphating solution of a low-temperature type under the conditions described below.

(1) Oxide on Surface of Steel Sheet

The major axis of oxides on the surface of the steel sheet was determined by taking a secondary electron image by using a scanning electron microscope with an accelerating voltage of 0.8 kV at a magnification of 30,000 times and by determining the length of the largest oxide in the field of view of the image. Oxides were identified by using a thin film X-ray diffraction method. In addition, the area fraction of Mn—Si complex oxides having a major axis of 200 nm or less was determined in the field of view in the secondary electron image described above. In addition, the area fraction of oxides having a major axis of more than 200 nm was determined in the field of view in the secondary electron image described above.

(2) Evaluation of phosphatability

The test piece taken from each of the obtained cold-rolled steel sheets was subjected to phosphating for 75 seconds by using a degreasing agent: FC-E2001, a surface conditioning agent: PL-X, and a phosphating agent: PALBOND (registered trademark) PB-SX35, which were produced by Nihon Parkerizing Co., Ltd. Here, phosphating is usually performed for 120 seconds. However, in the case of the practical treatment at an automobile company, since it is presumed that the treatment condition is severe due to contamination caused by, for example, oil spots, the treatment in the present evaluation was performed for 75 seconds, which was shorter than ordinary 120 seconds. Here, the temperature of the phosphating solution was 33° C.

The surface of each of the steel sheets after the phosphating was observed by using a scanning electron microscope at a magnification of 1000 times to determine whether or not there was a region in which no phosphate crystal was formed (so-called a "lack of hiding" and referred to as a "non-crystalline region" hereinafter) during the phosphating. A case with a non-crystalline region was judged as a case expressed by "Yes", and a case without a non-crystalline region was judged as a case expressed by "No".

The manufacturing conditions and the evaluation results are given in Table 2.

TABLE 2

| No. | Steel Grade | PVD Si Thickness (nm) | PVD SiO$_2$ Thickness (nm) | Annealing Condition Temperature (° C.) | Kind of Oxide | Major Axis of Oxide (nm) | Area Fraction of Mn-Si Complex Oxide Having a Major Axis of 200 nm or Less (%) | Phosphatability without Non-crystalline Region: No with Non-crystalline Region: Yes | Note |
|---|---|---|---|---|---|---|---|---|---|
| 1 | A | — | — | 800 | MnO | 1900 | 23.9 | Yes | Comparative Example 1 |
| 2 | A | 2 | — | 800 | Mn$_2$SiO$_4$ | 105 | 9.5 | No | Example 1 |
| 3 | A | 20 | — | 850 | Mn$_2$SiO$_4$ | 195 | 7.7 | No | Example 2 |
| 4 | B | — | — | 850 | MnO | 1500 | 19.8 | Yes | Comparative Example 2 |
| 5 | B | 6 | — | 850 | Mn$_2$SiO$_4$ | 124 | 9.1 | No | Example 3 |
| 6 | B | 15 | — | 850 | Mn$_2$SiO$_4$ | 109 | 7.2 | No | Example 4 |
| 7 | C | — | — | 825 | MnO | 1700 | 16.5 | Yes | Comparative Example 3 |
| 8 | C | 3 | — | 825 | Mn$_2$SiO$_4$ | 131 | 8.9 | No | Example 5 |
| 9 | C | 16 | — | 825 | Mn$_2$SiO$_4$ | 152 | 6.5 | No | Example 6 |
| 10 | D | — | — | 850 | Mn$_2$SiO$_4$ | 150 | 9.3 | No | Reference Example 1 |
| 11 | A | — | 5 | 800 | Mn$_2$SiO$_4$ | 111 | 8.8 | No | Example 7 |
| 12 | A | — | 20 | 850 | Mn$_2$SiO$_4$ | 184 | 8.1 | No | Example 8 |
| 13 | B | — | 5 | 850 | Mn$_2$SiO$_4$ | 131 | 8.5 | No | Example 9 |
| 14 | B | — | 19 | 850 | Mn$_2$SiO$_4$ | 91 | 6.9 | No | Example 10 |
| 15 | C | — | 4 | 825 | Mn$_2$SiO$_4$ | 155 | 9.2 | No | Example 11 |
| 16 | C | — | 17 | 825 | Mn$_2$SiO$_4$ | 160 | 5.8 | No | Example 12 |
| 17 | A | 5 | 5 | 825 | Mn$_2$SiO$_4$ | 112 | 6.6 | No | Example 13 |
| 18 | A | — | — | 890 | MnO | 231 | 13.3 | Yes | Comparative Example 4 |

As indicated by comparative examples 1 through 3, in the case where the Si content in the steel sheet was less than 0.10 mass % and Si was not applied to the surface of the steel sheet, MnO oxides having a large grain diameter of more than 1000 nm are formed on the surface of the steel sheet after the continuous annealing. In addition, in the case of comparative examples 1 through 4, the area fraction of oxides having a major axis of more than 200 nm was 1% or more. For example, in the case of comparative example 4, MnO oxides having a major axis of more than 200 nm were formed on the surface of the steel sheet after the continuous annealing, and the area fraction of the oxides was 15.2%. It is clarified that, since such MnO oxides having a large grain diameter is not dissolved in the phosphating solution, the formation of a phosphate crystal is inhibited, which results in a deterioration in phosphatability and a non-crystalline region is generated.

On the other hand, as indicated by examples 1 through 13, it is clarified that, in the case of the cold-rolled steel sheet for annealing to which Si and/or Si oxide were applied to the surface, even if the Si content in the steel sheet is less than 0.10 mass %, Mn$_2$SiO$_4$ oxides having a small grain diameter of about 100 nm were formed on the surface of the steel sheet after the continuous annealing. In addition, in the case of examples 1 through 13, the area fraction of oxides having a major axis of more than 200 nm was less than 1%. It is clarified that Mn$_2$SiO$_4$ oxides having a small grain diameter is dissolved in the phosphating solution, which results in a significant improvement in phosphatability and a non-crystalline region was not generated.

INDUSTRIAL APPLICABILITY

Since the cold-rolled steel sheet according to aspects of the present invention has excellent phosphatability, the steel sheet can preferably be used not only as a material for automobile body parts but also as a material for applications such as for home electrical appliances and for architectural members in which similar properties are required.

The invention claimed is:

1. A cold-rolled and annealed steel sheet having a chemical composition containing:
   C: 0.01 mass % to 0.30 mass %;
   Si: less than 0.10 mass % (including 0.0 mass %);
   Mn: 2.0 mass % to 3.5 mass %;
   P: 0.05 mass % or less;
   S: 0.01 mass % or less; and
   Al: 0.15 mass % or less, the balance being Fe and inevitable impurities,
   wherein an area fraction of oxides having a major axis of more than 200 nm existing on a surface of the steel sheet is less than 1%, and
   wherein an area fraction of Mn-Si complex oxides having a major axis of 200 nm or less existing on the surface of the steel sheet is 1% to 10%.

2. A method for manufacturing the cold-rolled and annealed steel sheet according to claim 1, the method comprising:
   applying Si and/or Si oxide to a surface of a steel sheet with an average coating thickness of 1 nm to 20 nm, the steel sheet having a chemical composition containing:
   C: 0.01 mass % to 0.30 mass %;
   Si: less than 0.10 mass % (including 0.0 mass %);
   Mn: 2.0 mass % to 3.5 mass %;
   P: 0.05 mass % or less;
   S: 0.01 mass % or less; and
   Al: 0.15 mass % or less, the balance being Fe and inevitable impurities; and
   thereafter performing annealing.

3. The method for manufacturing a cold-rolled and annealed steel sheet according to claim 2, wherein the steel sheet has the chemical composition further containing at least one selected from the following groups A and B consisting of:
   Group A: one, two, or more selected from:
   Nb: 0.3 mass % or less;
   Ti: 0.3 mass % or less;

V: 0.3 mass % or less;
Mo: 0.3 mass % or less;
Cr: 0.5 mass % or less;
B: 0.006 mass % or less; and
N: 0.008 mass % or less; and
Group B: one, two, or more selected from:
Ni: 2.0 mass % or less;
Cu: 2.0 mass % or less;
Ca: 0.1 mass % or less; and
REM: 0.1 mass % or less.

4. The cold-rolled and annealed steel sheet according to claim 1, wherein the chemical composition further contains at least one selected from the following groups A and B consisting of:
Group A: one, two, or more selected from:
Nb: 0.3 mass % or less;
Ti: 0.3 mass % or less;
V: 0.3 mass % or less;
Mo: 0.3 mass % or less;
Cr: 0.5 mass % or less;
B: 0.006 mass % or less; and
N: 0.008 mass % or less; and
Group B: one, two, or more selected from:
Ni: 2.0 mass % or less:
Cu: 2.0 mass % or less;
Ca: 0.1 mass % or less; and
REM: 0.1 mass % or less.

5. A method for manufacturing the cold-rolled and annealed steel sheet according to claim 4, the method comprising:
applying Si and/or Si oxides to the surface of the steel sheet with an average coating thickness of 1 nm to 20 nm; and
thereafter performing annealing.

6. The cold-rolled and annealed steel sheet according to claim 4, wherein the steel sheet is a cold-rolled steel sheet which is further subjected to phosphating.

7. The cold-rolled and annealed steel sheet according to claim 1, wherein the steel sheet is a cold-rolled steel sheet which is further subjected to phosphating.

* * * * *